US007606082B2

(12) United States Patent
Shimabukuro et al.

(10) Patent No.: US 7,606,082 B2
(45) Date of Patent: Oct. 20, 2009

(54) SEMICONDUCTOR CIRCUIT, INVERTER CIRCUIT, SEMICONDUCTOR APPARATUS, AND MANUFACTURING METHOD THEREOF

(75) Inventors: Hiroshi Shimabukuro, Matsumoto (JP); Hideto Kobayashi, Matsumoto (JP); Yoshihiro Shigeta, Matsumoto (JP); Gen Tada, Matsumoto (JP)

(73) Assignee: Fuji Electric Device Technology Co., Ltd. (JP)

( * ) Notice: Subject to any disclaimer, the term of this patent is extended or adjusted under 35 U.S.C. 154(b) by 180 days.

(21) Appl. No.: 11/532,083

(22) Filed: Sep. 14, 2006

(65) Prior Publication Data

US 2007/0064476 A1 Mar. 22, 2007

(30) Foreign Application Priority Data

Sep. 16, 2005 (JP) ............................ 2005-269359

(51) Int. Cl.
*G11C 7/10* (2006.01)

(52) U.S. Cl. ............................ 365/189.05; 365/189.09; 365/208; 365/230.06; 365/174; 345/60; 345/204; 345/206; 257/206; 257/207; 257/208

(58) Field of Classification Search ................. 365/174, 365/189.09, 208, 230.06, 189.05; 345/60, 345/204; 257/197, 206, 207, 208
See application file for complete search history.

(56) References Cited

U.S. PATENT DOCUMENTS 5,081,400 A * 1/1992 Weber et al. ............. 315/169.4
5,343,091 A * 8/1994 Terada ........................ 326/116
6,034,482 A * 3/2000 Kanazawa et al. ........ 315/169.4
6,072,729 A * 6/2000 Casper .................. 365/189.05
6,160,529 A * 12/2000 Asao et al. .................... 345/60
6,242,860 B1 * 6/2001 Sasao et al. ................. 313/586
6,252,568 B1 * 6/2001 Iseki et al. ..................... 345/60
6,522,323 B1 * 2/2003 Sasaki et al. ................ 345/204

(Continued)

*Primary Examiner*—Van Thu Nguyen
*Assistant Examiner*—Eric Wendler
(74) *Attorney, Agent, or Firm*—Rossi, Kimms & McDowell LLP

(57) ABSTRACT

The semiconductor circuit includes a voltage-controlled semiconductor device (N)N, the resistance value of which is controllable with a high voltage, the drain terminal of the N can be connected to the gate terminal (control terminal) of an output semiconductor device ($N_O$) via a resistor (R) or to a last output stage of the driver circuit, the source terminal of the N is connected to the emitter terminal of the $N_O$, and the gate terminal of the N is connected to the collector terminal, which is the output terminal, of the $N_O$. When the input terminal of the semiconductor circuit is at the Hi-level, the $N_O$ OFF. By connecting the output terminal of the $N_O$ to the high-potential-side of a high-voltage circuit disposed separately and the negative electrode of a control power supply (VDD) to the low-potential-side of the high-voltage circuit in the state, in which the $N_O$ is OFF, a desired high voltage is applied between the collector and emitter of the $N_O$. Since a p-channel MOSFET ($P_D$) is turned ON as the input terminal potential is changed over to the Lo-level and the high voltage is still being applied to the output terminal of the $N_O$, the N is turned ON and the $N_O$ is brought into the ON-state, in which the current driving ability of the $N_O$ is low. The semiconductor circuit can protect the devices from an over voltage with a simple circuit configuration.

22 Claims, 9 Drawing Sheets

U.S. PATENT DOCUMENTS

| | | | | |
|---|---|---|---|---|
| 6,525,701 | B1 * | 2/2003 | Kang | 345/60 |
| 6,697,286 | B2 * | 2/2004 | Nakagawa | 365/189.05 |
| 7,408,544 | B2 * | 8/2008 | Okumura et al. | 345/211 |
| 2002/0122016 | A1 * | 9/2002 | Iwasa et al. | 345/60 |
| 2002/0175631 | A1 * | 11/2002 | Kim | 315/169.1 |
| 2005/0134533 | A1 | 6/2005 | Sasada et al. | |

* cited by examiner

SEMICONDUCTOR CIRCUIT, INVERTER CIRCUIT, SEMICONDUCTOR APPARATUS, AND MANUFACTURING METHOD THEREOF

BACKGROUND

Plasma displays with a wide screen format are being widely adopted as the next generation displays, namely replacing the old Brownian tube technology. An alternating-current-type (AC) plasma display, which has been used mainly, feeds discharge sustaining pulse voltages alternately to panel electrodes to display images. The three-electrodes surface-discharge structure employed for the plasma displays includes a sustain electrode for display discharge, a scan electrode for display discharge, and an address electrode for write discharge. The scan and address electrodes activate write discharge therebetween. The scan and sustain electrodes activate surface discharge for displaying therebetween.

A data driver integrated circuit (IC) is connected to the address electrode, a scan driver IC to the scan electrode, and a sustain driver circuit to the sustain electrode. Since the power supply voltage of around 140 V is applied to the scan driver IC and a power supply voltage of around 200 V to the sustain driver circuit, it is necessary for a 42 inch display, for example, to generate the maximum instantaneous current of around 300 A in total flow therein. The maximum instantaneous current mainly contains gas discharge current. The maximum load occurs when the gas discharge current flows. A light load occurs when the capacitive electric charges from the panel electrode potential change flow. Therefore, it is important to precisely operate the scan driver IC and the sustain driver circuit.

In the following descriptions, the voltages do not represent the absolute potentials but the potential differences applied in the operating states of the constituent devices. Referring to FIG. 7, which is a block circuit diagram of a conventional scan driver IC, the conventional scan driver IC includes two n-channel insulated gate bipolar transistors (IGBTs: hereinafter referred to as "$N_O$H and $N_O$L", respectively) 101 and 102 working as output devices, each exhibiting a high breakdown voltage. The $N_O$H and $N_O$L transistors 101,102 are connected in series between a high-potential power supply terminal (hereinafter referred to as a "VDH") 103 and a ground terminal (hereinafter referred to as "GND") 104, constituting a totem pole output circuit that feeds a bias voltage from a high-potential power supply to the high-side device ($N_O$H 101). The gate terminal of the $N_O$H transistor 101 is connected to the connection point of a p-channel MOSFET (hereinafter referred to as a "$P_D$") 105 and an n-channel MOSFET (hereinafter referred to as an "$N_D$") 106, both constituting a driver circuit. The gate terminal of the $N_O$L transistor 102 is connected to a driver circuit, configured in a control signal generating section 109 incorporating a timer circuit therein, to change the potential of an output terminal (hereinafter referred to as a "$D_O$") 110. The control signal generating section 109 is disposed, assuming the short circuit of the inverter output ($D_O$) 110 with the power supply, for lowering the gate voltages of the $N_O$H and $N_O$L transistors 101,102 to prevent the IC from being broken down when the next clock signal is not input to the control signal generating section 109 within a certain period after the last clock signal is input thereto.

Referring to FIG. 8, which is an equivalent circuit diagram of a conventional sustain driver circuit, the conventional sustain driver circuit includes an n-channel IGBT (hereinafter referred to as an "$N_O$H") 111, which is an output device on the high side, and an n-channel IGBT (hereinafter referred to as an "$N_O$L") 112, which is an output device on the low side. The $N_O$H and $N_O$L transistors 111, 112 are connected in series between an external high-potential power supply terminal and a ground terminal, constituting a totem pole output circuit based on the so-called boot-strap system. The gate terminals of the $N_O$H and $N_O$L transistors 111, 112 are connected to the respective driver circuits, each including a p-channel MOSFET and an n-channel MOSFET connected in series.

For improving the reliability, a control circuit has been proposed for preventing an over voltage in the high-side control power supply voltage, for preventing the output devices from malfunctioning, and for preventing breakdown of the output devices. See Unexamined Japanese Patent Application 2005-175454, which corresponds to USPGP 2005/0134533, for example. For protection against an over voltage and for size and costs reduction, the control circuit described above utilizes a bipolar transistor circuit to clamp the control power supply voltage.

Referring to FIG. 9, which illustrates a fundamental block circuit diagram of a conventional driver circuit, the conventional driver circuit will be described below. The drain terminals of a p-channel MOSFET ($P_D$) 121 exhibiting a low breakdown voltage and an n-channel MOSFET ($N_D$) 122 exhibiting a low breakdown voltage are connected to each other. The source terminal of the $P_D$ 121 is connected to the positive electrode of a control power supply (hereinafter referred to as a "VDD") 123 and the source terminal of the $N_D$ 122 to the negative electrode of the VDD 123. The gate terminals of the $P_D$ 121 and the $N_D$ 122 are connected to each other and to an input terminal. The emitter terminal of an n-channel IGBT (hereinafter referred to as an "$N_O$") 124, which is an output device exhibiting a high breakdown voltage, is connected to the negative electrode of the VDD 123. The gate terminal of the $N_O$ 124 is connected to the drain terminals of the $P_D$ 121 and the $N_D$ 122 via a resistor (hereinafter referred to as an "R") 125. The collector terminal, which is an output terminal, of the $N_O$ 124 is connected, for example, to a load. Alternatively, an n-channel MOSFET or an NPN transistor can be substituted for the $N_O$ 124. Depending on the circuit characteristics, R 125 may be unnecessary.

When the input terminal is biased at a high level (hereinafter referred to as a "Hi-level": the positive potential of VDD 123) in the driver circuit as described above, the $P_D$ 121 is ON and the $N_D$ 122 is OFF, biasing the drain terminals thereof at a low level (hereinafter referred to as a "Lo-level": the negative potential of VDD 123). Since the gate potential of the $N_O$ 124 connected to the drain terminals of the $P_D$ 121 and the $N_D$ 122 is at the Lo-level, the $N_O$ 124 is brought into the OFF-state. By connecting the output terminal of the $N_O$ 124 in the OFF-state to the high potential side of a high-voltage circuit disposed separately and by connecting the negative electrode of VDD 123 to the low potential side of the high-voltage circuit, a desired high voltage is applied between the collector and emitter of the $N_O$ 124. Since the gate potential of the $N_O$ 124 is set at the Hi-level as the input terminal potential is changed over to the Lo-level and the $N_O$ 124 is brought into the ON-state, so that current flows from the high-voltage circuit into the collector of the $N_O$ 124 and returns to the high-voltage circuit from the emitter of the $N_O$ 124.

When the main current flows as described above, the output terminal voltage of the $N_O$ 124 will lower, if no anomaly, such as a terminal short-circuit, occurs. As the output terminal voltage of the $N_O$ 124 lowers, the current, caused by discharging the electric charges in the feedback capacitance between the collector and gate of the $N_O$ 124, flows from the collector of the $N_O$ 124 to the gate of the $N_O$ 124 via the high-voltage circuit (including the output device), the negative electrode of the VDD 123, the positive electrode of the VDD 123, and the $P_D$ 121. The current raises the voltage of the VDD 123.

In the usual circuit design, the $P_D$ 121 is provided with a current feed ability enough to complete the charging of the gate of the $N_O$ 124 within a predetermined time, and the R 125 is set such that the R 125 relaxes the current fed by the $P_D$ 121 and the current flowing into the $N_O$ 124 from the feedback capacitance. The voltage of the VDD 123 is set to flow the gas discharge current in the plasma display panel with low resistance. Since the conventional driver circuit drives the gate of the $N_O$ 124 at the same voltage as the voltage under the maximum load even with the light load as previously described, vigorous output voltage variations occur, as well as noise occurring, via the feedback capacitance of the $N_O$ 124, further causing an over voltage on the VDD 123. However, the countermeasures described in the aforementioned published patent applications cannot solve the above-described problems drastically.

In the method that lowers the output device gate voltage, if the next clock signal is not input within a predetermined period of time after the last clock signal input, to prevent the IC from breaking down, sufficient gas discharge current cannot flow after lowering the gate voltage. Therefore, the above-described method has limitations on driving the plasma display panel. To solve the problems described above, a more complicated circuit configuration has been proposed. However, it is difficult to employ such complicated circuit configuration for the usual circuit since it increases the cost and creates problems associated with higher circuit integration.

Accordingly, there remains a need for a semiconductor circuit that provides over voltage protection without complicating the configuration thereof. The present invention addresses this need.

SUMMARY OF THE INVENTION

The present invention relates to a semiconductor circuit, an inverter circuit, and a semiconductor apparatus, and a manufacturing method thereof. More specifically, the present invention relates to a semiconductor circuit including a semiconductor device working as an output device and a driver circuit, the output terminal of which is connected to the control terminal of the semiconductor device, for driving the semiconductor device, an inverter circuit including such a semiconductor circuit, and a semiconductor apparatus including the semiconductor circuit or the inverter circuit formed on a semiconductor substrate.

One aspect of the present invention is a semiconductor circuit, which can include a semiconductor device working as an output device (hereinafter referred to as an "output semiconductor device"), a driver circuit driving the output semiconductor device, and another semiconductor device where its resistance can be controlled with a voltage (hereinafter referred to as a "voltage-controlled semiconductor device").

The output semiconductor device can have a control terminal, a reference terminal, and an output terminal. The driver circuit has an output connected to the control terminal. The voltage-controlled semiconductor device can include a first terminal, a second terminal, and a third terminal. The first terminal can be connected to the output semiconductor device or the driver circuit. The second terminal can be connected to the reference terminal. The third terminal can be connected to a potential that changes in response to the operations of the output semiconductor device.

The first terminal can be connected to the control terminal to control the potential applied to the control terminal. Alternatively, the first terminal can be connected to the last output stage of the driver circuit, with a resistor arranged between a power supply of the driver circuit and the last output stage so that the voltage of the driver circuit can be controlled. The resistor can exhibit nonlinear current versus voltage characteristics.

The third terminal can be connected to the output terminal. The third terminal can be connected to the output terminal via a voltage dividing means for dividing the output terminal voltage of the output semiconductor device. Alternatively, the third terminal can be grounded.

The voltage-controlled semiconductor device can be a MOSFET or a junction-type FET.

Another aspect of the present invention is an inverter circuit incorporating the semiconductor circuit described above.

Another aspect of the present invention is a semiconductor apparatus incorporating the semiconductor circuit described above. The output semiconductor device can formed on one semiconductor substrate and the driver circuit can be formed on another substrate, with the third terminal disposed independently.

Another aspect of the present invention is a method of manufacturing the semiconductor circuit described above. The method can include providing the output semiconductor device, providing the driver circuit, providing the voltage-controlled semiconductor device, connecting the first terminal to the output semiconductor device or the driver circuit, connecting the second terminal to the reference terminal, and connecting the third terminal to a potential that changes in response to the operations of the output semiconductor device.

The first terminal can be connected to the control terminal to control the potential applied to the control terminal or to a power supply of the driver circuit to control the power supply voltage of the driver circuit.

DETAILED DESCRIPTION

Now the invention will be described in detail hereinafter with reference to the accompanied drawings, which illustrate the preferred exemplary embodiments of the invention. The semiconductor circuit includes an output semiconductor device, a driver circuit, the output of which is connected to the control terminal of the output semiconductor device, for driving the output semiconductor device, and a voltage-controlled semiconductor device that controls the gate potential of the output semiconductor device or the power supply voltage of the driver circuit in response to the output potential of the output semiconductor device.

The circuit configuration according to a first embodiment that controls the gate potential of the output semiconductor device with the voltage-controlled semiconductor device and the circuit configuration according to a second embodiment that controls the power supply voltage of the driver circuit with the voltage-controlled semiconductor device will be described below.

The circuit configurations according to the first embodiment, which make the voltage-controlled semiconductor device function for the gate resistance of the output semiconductor device to control the gate potential of the output semiconductor device, will be described in detail below with reference to the accompanied FIGS. 1 through 4.

Figure 1:
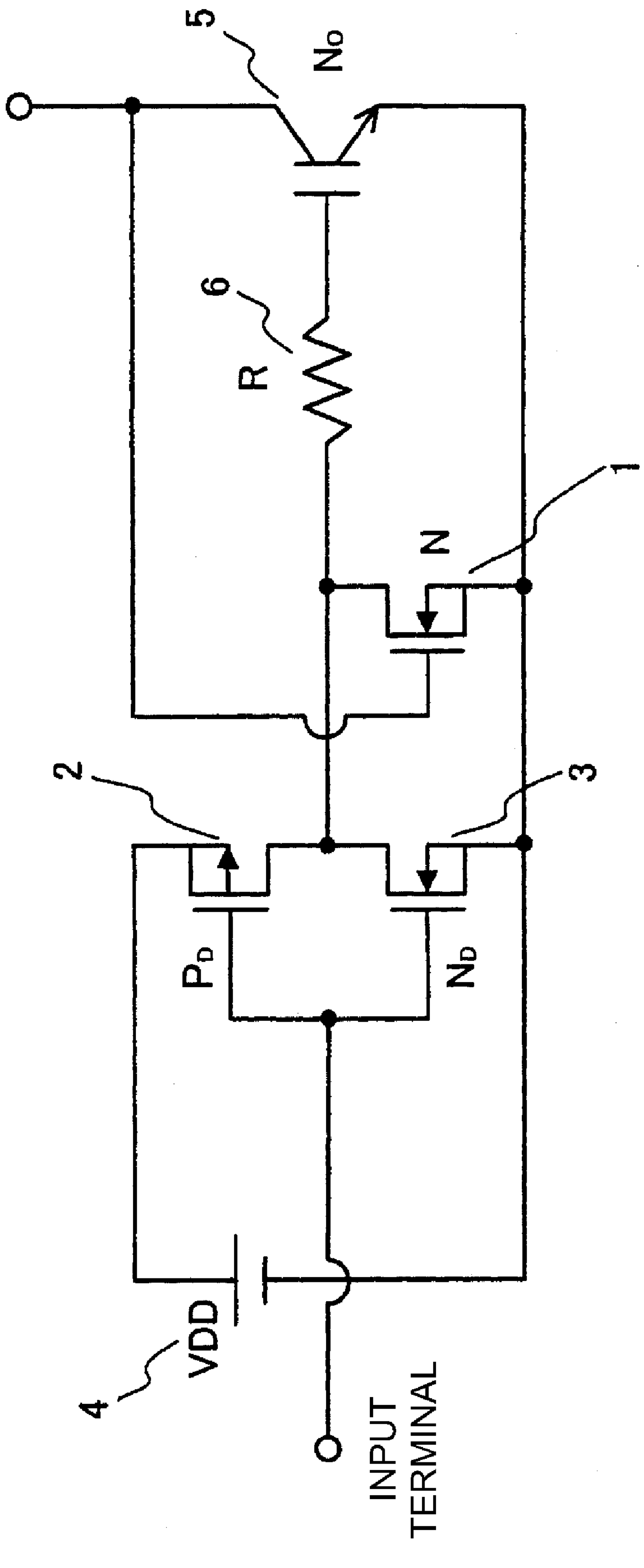
FIG. 1 is a block circuit diagram of a semiconductor circuit according to a first embodiment of the present invention.

Referring to FIG. 1, which is a block circuit diagram of a semiconductor circuit according to the first embodiment, the semiconductor circuit includes a driver circuit including a p-channel MOSFET ($P_D$) 2, an n-channel MOSFET ($N_D$) 3, and a control power supply (VDD) 4, an n-channel IGBT ($N_O$) 5 exhibiting a high breakdown voltage and working as an output device, and a voltage-controlled semiconductor device (hereinafter referred to as an "N") 1, arranged between the driver circuit and $N_O$ (output semiconductor device) 5, for controlling the gate potential of the $N_O$ 5. The drain terminals of the $P_D$ 2 and the $N_D$ 3, which both exhibit a low breakdown voltage and constituting the driver circuit, are connected to each other. The gate terminals of the $P_D$ 2 and the $N_D$ 3 are connected to each other and to an input terminal. The source terminal of the $P_D$ 2 is connected to the positive electrode of the VDD 4 and the source terminal of the $N_D$ 3 is connected to the negative electrode of the VDD 4.

The emitter terminal of the $N_O$ (output semiconductor device) 5 exhibiting a high breakdown voltage is connected to the negative electrode of the VDD 4 and the gate terminal of the $N_O$ 5 is connected to the drain terminals of the $P_D$ 2 and the $N_D$ 3 via a resistance (R) 6. The collector terminal of the $N_O$ 5, which is an output terminal, is connected, for example, to a load. Since the gate potential of the $N_O$ 5 is controlled with reference to the emitter potential of the $N_O$ 5, the emitter terminal of the $N_O$ 5 works as the reference terminal thereof.

According to the first embodiment, the N 1 is disposed in the circuit configuration described above for controlling the gate potential of the $N_O$ 5. The N 1, where the resistance value of which is controllable with a high voltage, includes three terminals: a drain terminal, a source terminal and a gate terminal. The drain terminal of the N 1 is connected to the gate terminal (control terminal) of the $N_O$ (output semiconductor device) 5 via the R 6. The drain terminal of the N 1 is connected also to the drain terminals of the $P_D$ 2 and the $N_D$ 3 on the driver circuit side. The source terminal of the N 1 is connected to the emitter terminal (reference terminal) of the $N_O$ 5 and to the source terminal of the $N_D$ 3. The gate terminal of the N 1 is connected to the collector terminal, which is the output terminal, of the $N_O$ 5. Due to the connections described above, the gate terminal of the N 1 is connected to the potential (output potential), the difference of which from the source terminal potential changes in response to the switching operations of the $N_O$ 5.

By connecting the output terminal of the semiconductor circuit to the high potential side of a high-voltage circuit disposed separately and the negative electrode of the VDD 4 to the low potential side of the high-voltage circuit, a high voltage is applied to a gate oxide film forming the gate terminal of the N 1. Therefore, a MOSFET exhibiting a low breakdown voltage and including a thick gate oxide film or a junction-type FET is used for the N 1. By using a MOSFET exhibiting a low breakdown voltage and including a gate oxide film of 500 nm in thickness for the N 1 under the assumption that the electric field strength practically applicable to the oxide film with no problem is 4 MV/cm, the gate oxide film can endure a gate voltage of 200 V applied thereto. The breakdown voltage between the drain and source of the N 1 is set to be almost equal to that of the $P_D$ 2 or the $N_D$ 3 with no problem. It is necessary for the ON-resistance of the N 1 to be almost equal to that of the $P_D$ 2. Although the gate oxide film of the N 1 is thick 500 nm, it is possible to apply a high voltage to the gate oxide film of the N 1. Therefore, the ON-resistance of the N 1 can be set to be almost equal to that of the $N_D$ 3 exhibiting a low breakdown voltage, to allow the gate oxide film thereof to be thin. Therefore, the area occupied by the N 1 can be set to be almost equal to that occupied by $N_D$ 3 with no problem.

As described above, the N 1 that controls the low drain output thereof with a high gate voltage is not an ordinary one. However, the device that meets the above-described conditions is manufacturable through the general CMOS process. For example, the thick gate oxide film can be formed through the local oxidation of silicon (LOCOS) process employed for forming a device separation structure on a semiconductor substrate.

Now the operations of the semiconductor circuit according to the first embodiment will be described below. When the input terminal potential is Hi (the positive potential of VDD 4), the $P_D$ 2 is OFF, the $N_D$ 3 is ON, and the drain potentials of the $P_D$ 2 and the $N_D$ 3 are set at the Lo-level (the negative potential of the VDD 4). Since the gate potential of the $N_O$ 5 connected to the drain terminals of the $P_D$ 2 and the $N_D$ 3 is set also at the Lo-level, the $N_O$ 5 is brought into the OFF-state. In this state, by connecting the output terminal of the $N_O$ 5 to the high potential side of the high-voltage circuit disposed separately and the negative electrode of VDD 4 to the low potential side of the high-voltage circuit, a desired high voltage is applied between the collector and emitter of the $N_O$ 5. Since the high voltage same with that applied to the output terminal of the $N_O$ 5 is applied, at the same time, to the gate of the N 1, the N 1 is in the ON-state.

By changing over the input terminal potential to the Lo-level in this state, the gate potential of the $N_O$ 5 rises but does not reach the Hi-level soon. Since the $P_D$ 2 is in the ON-state and the high voltage is still being applied to the output terminal of the $N_O$ 5, the N 1 is also in the ON-state. Since the ON-resistance values of the N 1 and the $P_D$ 2 are set to be almost the same as described above, the gate potential of the $N_O$ 5 is almost half the potential of the VDD 4. By setting half the potential of the VDD 4 to be higher than the gate threshold voltage of the $N_O$ 5, current flows from the high-voltage circuit to the collector of the $N_O$ 5 and returns from the emitter of the $N_O$ 5 to the high-voltage circuit in spite of the low current driving ability of the $N_O$ 5, since the $N_O$ 5 is ON. Since the current driving ability of the $N_O$ 5 is suppressed, the output terminal voltage of the $N_O$ 5 lowers relatively slowly. Since the gate voltage of the N 1 lowers in association with the output terminal voltage lowering of the $N_O$ 5, the resistance value of the N 1 rises and the gate voltage of the $N_O$ 5 also rises gradually.

As the output terminal voltage of the $N_O$ 5 exceeds the threshold value of the N 1 to the lower side, the N 1 is brought into the OFF-state. Since the gate voltage of the $N_O$ 5 reaches the Hi-level, the $N_O$ 5 is brought into the state, in which the $N_O$ 5 exhibits a sufficient current driving ability.

In contrast to the conventional semiconductor circuit, as the output terminal voltage of the $N_O$ 5 changes more slowly, the peak value of the discharge current discharging the electric charges stored in the feedback capacitance between the collector and gate of the $N_O$ 5 becomes lower. Therefore, the voltage rise of the VDD (control power supply) 4 is suppressed. Since the feedback capacitance discharge current flows from the collector of the $N_O$ 5 to the gate of the $N_O$ 5 via the high-voltage circuit and the N 1 while the N 1 is ON, this discharge current path also prevents the VDD (control power supply) 4 from being affected adversely. If the output terminal of the $N_O$ 5 is short-circuited directly with the power supply, the output terminal voltage of the $N_O$ 5 will not lower. Consequently, since the gate potential of the $N_O$ 5 remains low and the $N_O$ 5 is in the state where the current driving ability thereof is low, the $N_O$ 5 is hardly destroyed. As described above, the semiconductor circuit according to the first embodiment can prevent noises via the feedback capacitance with the simple circuit configuration thereof and can protect the devices from an over voltage, when an anomaly occurs.

Now the application of the semiconductor circuit according to the first embodiment to the scan driver IC and the sustain driver circuit of the plasma display will be described below. In the operating mode of the driver circuit for driving an AC plasma display panel, the output device, to which a high voltage is applied, is different from the output device for flowing high current. In other words, when a high voltage is applied to the high-side device, the device for flowing gas discharge current is the low-side device. The gate voltage of the device, to which a high voltage is applied, is 0 V. On the other hand, the gate voltage of the device for flowing gas discharge current is 5 V for the most scan driver ICs and 15 V for the most sustain driver circuits.

For shifting to the next step after the gas discharge is completed, the voltage of the device, to which the gate voltage has been applied, is changed over to 0 V and, then, the gate voltage of the device, to which the high voltage has been applied, is changed over from 0 V to a predetermined value. The electrode potential change in the plasma display panel sets the plasma display panel in the next gas discharge state. The voltage applied to the output device in the driver circuit changes from a high one to a low one (0 V finally). The current made to flow by the applied voltage change contains only the capacitive electric charge component caused by the panel electrode potential change, which is about a quarter the maximum current flowing at the time of gas discharge.

Figure 2:
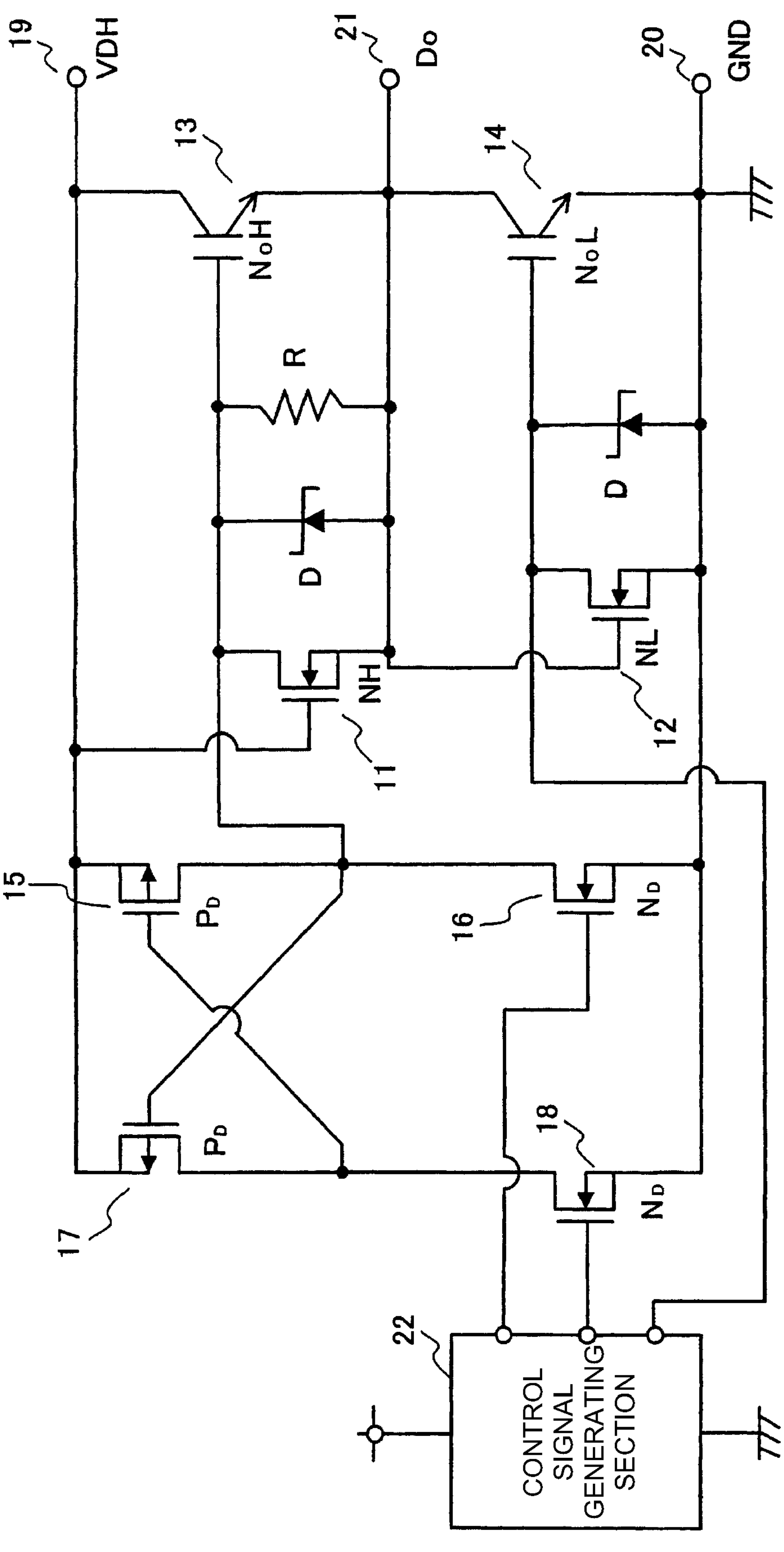
FIG. 2 is a block circuit diagram of a scan driver IC including the semiconductor circuit according to the first embodiment.

FIG. 2 is a block circuit diagram of a scan driver IC incorporating the semiconductor circuit according to the first embodiment. The scan driver IC includes an output semiconductor device ($N_O$H) 13 on the high level side (Hi-side), an output semiconductor device ($N_O$L) 14 on the low level side (Lo-side), a driver circuit for driving the $N_O$H 13 including p-channel MOSFETs ($P_D$'s) 15, 17 and n-channel MOSFETs ($N_D$'s) 16, 18, a voltage-controlled semiconductor device (hereinafter referred to as an "NH") 11 for controlling the gate potential of $N_O$H 13, and a voltage-controlled semiconductor device (hereinafter referred to as an "NL") 12 for controlling the gate potential of the $N_O$L 14. The driver circuit for driving the $N_O$L 14 is configured in a control signal generating section 22.

The two n-channel IGBTs ($N_O$H and $N_O$L) 13 and 14 working as output semiconductor devices are connected in series to each other between a high-potential power supply terminal (VDH) 19 and a ground terminal (GND) 20. The $P_D$ 15, the $P_D$ 17, the $N_D$ 16, and the $N_D$ 18 constituting the driver circuit turn the $N_O$H 13 ON and OFF in response to the control signal that controls the signal generating section 22 outputs. The NH 11 and the NL 12, which are capable of controlling the respective resistance values with a high voltage, are formed of n-channel MOSFETs, the gate oxide films of which are thick. The drain terminal of the NH 11 is connected to the gate terminal of the $N_O$H 13 on the Hi-side. The source terminal of the NH 11 is connected to an inverter output ($D_O$) 21 (the emitter terminal, which is the reference terminal, of the $N_O$H 13). The gate terminal of the NH 11 is connected to the VDH 19 (the collector terminal, which is the output terminal, of the $N_O$H 13). The drain terminal of the NL 12 is connected to the gate terminal of the $N_O$L 14 on the Lo-side. The source terminal of the NL 12 is connected to the GND 20 (the emitter terminal, which is the reference terminal, of the $N_O$L 14). The gate terminal of the NL 12 is connected to the $D_O$ 21 (the collector terminal, which is the output terminal, of the $N_O$L 14). For example, n-channel MOSFETs, the channel length L thereof is 2 μm, the channel width W thereof is 4 μm, the threshold Vth thereof is 17.4 V, and the MOS resistance Ron thereof at the gate voltage of 100 V is 2.5 kΩ, can be used for the NH 11 and the NL 12.

As described earlier with reference to FIG. 1, the gate voltages applied to the $N_O$H 13 on the Hi-side and the $N_O$L 14 on the Lo-side can be controlled separately with the potential change of the $D_O$ 21. If an output short-circuit anomaly occurs, the gate voltage of the relevant output semiconductor device will remain low, since the potential of the $D_O$ 21 does not change. Therefore, the relevant output semiconductor device is hardly destroyed. Since NH 11 and NL 12 can be small in size with no problem, a pair of output semiconductor devices is arranged for every one of the many outputs, e.g., of a scan driver IC.

Figure 3:
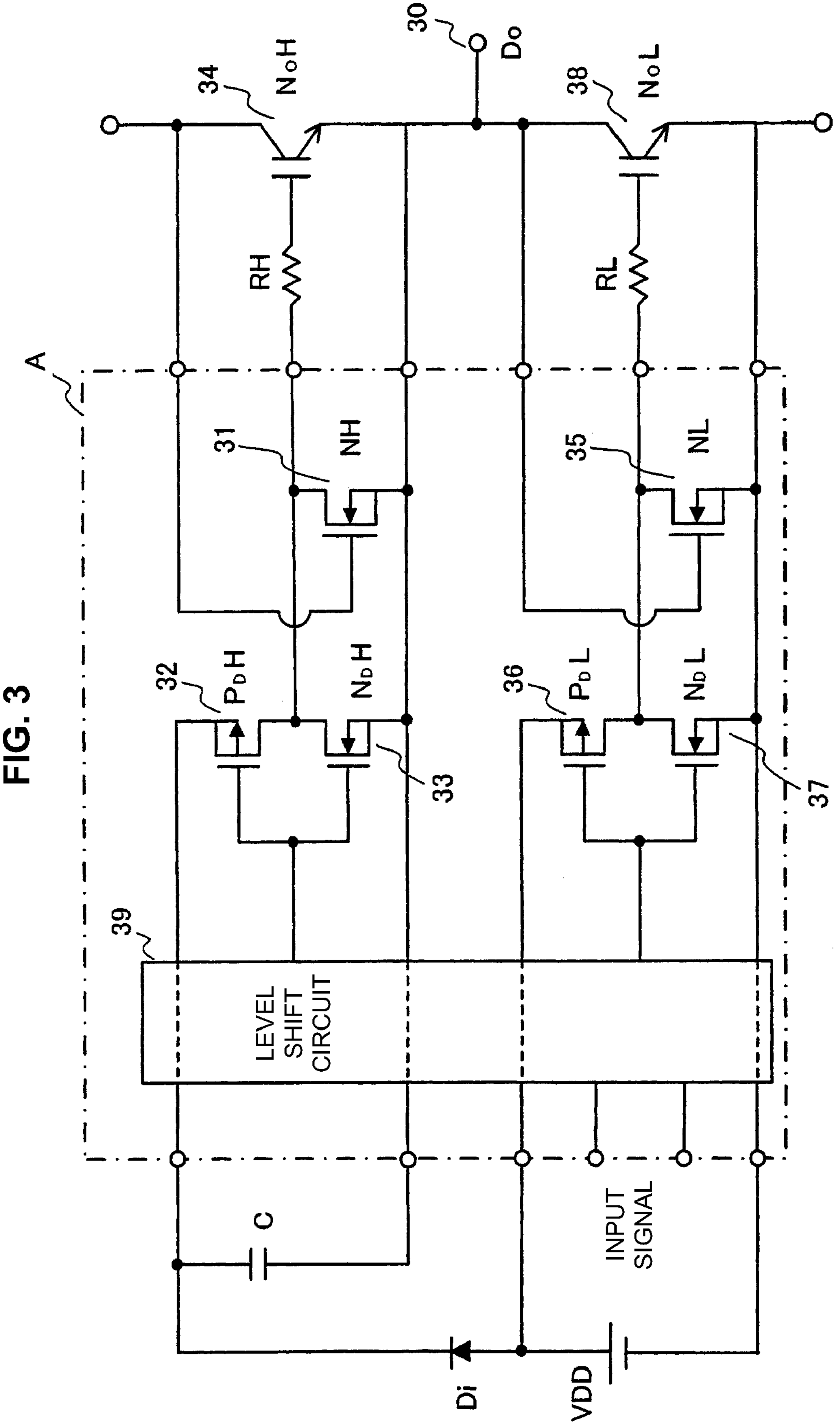
FIG. 3 is a block circuit diagram of a first embodiment of a sustain driver circuit including the semiconductor circuit according to the first embodiment.

FIG. 3 is a block circuit diagram of a sustain driver circuit incorporating the semiconductor circuit according to the first embodiment. The sustain driver circuit in FIG. 3 has a boot strap structure including two systems of the circuit shown in FIG. 1. The sustain driver circuit includes a first semiconductor circuit system and a second semiconductor circuit system. The first semiconductor circuit system includes an output semiconductor device ($N_O$H) 34 on the Hi-side, a p-channel MOSFET ($P_D$H) 32 for driving the $N_O$H 34, an n-channel MOSFET ($N_D$H) 33 also for driving the $N_O$H 34, and an n-channel MOSFET (NH) 31 for controlling the gate potential of the $N_O$H 34. The second semiconductor circuit system includes an output semiconductor device ($N_O$L) 38 on the Lo-side, a p-channel MOSFET ($P_D$L) 36 for driving the $N_O$L 38, an n-channel MOSFET ($N_D$L) 37 also for driving the $N_O$L 38, and an n-channel MOSFET (NL) 35 for controlling the gate potential of the $N_O$L 38. The first and second semiconductor circuit systems control the potential of an inverter output ($D_O$) 30 in response to the control signal output from a level shift circuit 39.

Each semiconductor circuit system has a configuration same with the circuit configuration shown in FIG. 1. The drain terminal of NH 31 on the Hi-side is connected to the gate terminal of the $N_O$H 34. The source terminal of the NH 31 is connected to the $D_O$ 30. The gate terminal of the NH 31 is connected to the collector terminal of the $N_O$H 34. The drain terminal of the NL 35 on the Lo-side is connected to the gate terminal of the $N_O$L 38. The source terminal of the NL 35 is connected to the ground terminal (the emitter terminal, which is the reference terminal, of the $N_O$L 38). The gate terminal of the NL 35 is connected to the collector terminal, which is the output terminal, of the $N_OL$ 38.

For example, thick-film n-channel MOSFETs, the channel length L thereof is 2 μm, the channel width W thereof is 300 μm, the threshold Vth thereof is 15.6 V, and the MOS resistance Ron thereof at the gate voltage of 200 V is 12.5 kΩ, can be used for the NH 31 and the NL 35. The sizes of the NH 31 and the NL 35 can be the same as those of the NDH 33 and the NDL 37.

As described earlier with reference to FIG. 1, the gate voltages applied to the $N_OH$ 34 on the Hi-side and the $N_OL$ 38 on the Lo-side can be controlled separately with the potential change of the $D_O$ 30. If an output short-circuit anomaly occurs, the gate voltage of the relevant output semiconductor device will remain low, since the potential of the $D_O$ 30 does not change. Therefore, the relevant output semiconductor device is hardly destroyed.

Since the NH 31 and the NL 35 are not general devices, it is preferable to incorporate the area A surrounded by the single-dotted lines, which is a driver section excluding the output semiconductor devices, as a circuit into an IC. The gate terminals of the NH 31 and the NL 35 are disposed independently in the IC so that the gate terminals of the NH 31 and the NL 35 can be connected to the $N_OH$ 34 and the $N_OL$ 38, respectively. By connecting the gate terminals of the NH 31 and the NL 35 to the collector terminals, which are the output terminals, of the $N_OH$ 34 and the $N_OL$ 38, respectively, the sustain driver circuit including the semiconductor circuits according to the first embodiment exhibits the expected effects. By connecting the gate terminals of the NH 31 and the NL 35 to the respective source potential sides, the sustain driver circuit according to the invention is used in the same manner as the conventional sustain driver circuit.

The semiconductor circuit according to the first embodiment has been described in connection with the scan driver IC and the sustain driver circuit of a plasma display. The semiconductor circuit according to the first embodiment can reduce the driving current to prevent noise in the state where a high voltage is applied to the output semiconductor device, and can obtain a sufficient driving power for flowing high current in the state where only a low voltage is applied to the output semiconductor device. Since only one device is added to one circuit system for realizing the functions described above and since the control is performed automatically, an inexpensive and simple semiconductor circuit, an inverter circuit, and a semiconductor apparatus can be obtained without employing any complicated circuit configuration or any complicated control method.

The semiconductor circuit according to the first embodiment is applicable also to the general power device driver circuits. In considering the safe operating zone of a fundamental output device in the general power device driver circuit, a large amount of heat is generated in the high voltage and high current region of the device, further destructing the device frequently. Therefore, by employing the above circuit, a dangerous operating zone can be avoided relatively easily.

Figure 4:
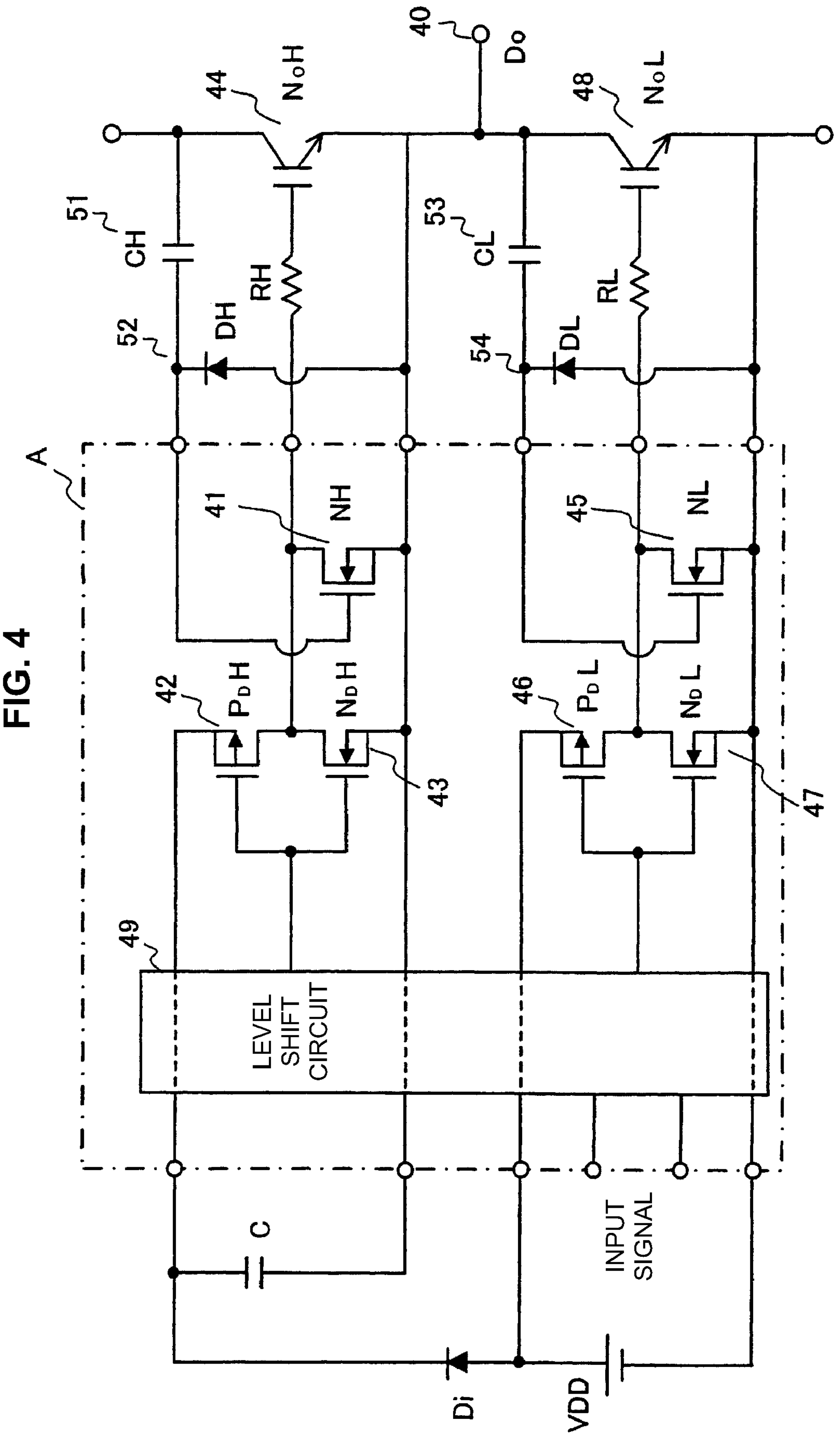
FIG. 4 is a block circuit diagram of an output driver circuit for an inverter circuit including the semiconductor circuit according to the first embodiment.

FIG. 4 is a block circuit diagram of an output driver circuit for an inverter circuit incorporating the semiconductor circuit according to the first embodiment. In FIG. 4, the semiconductor circuit according to the first embodiment is incorporated to the output driver circuit of a general inverter circuit for driving a motor. The inverter output is connected usually to a three-phase power supply of 600 V. In FIG. 4, the circuit for only one phase is shown. In the same manner as in FIG. 3, the output driver circuit in FIG. 4 includes a first semiconductor circuit system and a second semiconductor circuit system. The first semiconductor circuit system includes an output semiconductor device ($N_OH$) 44 on the Hi-side, a p-channel MOSFET ($P_DH$) 42 for driving the $N_OH$ 44, an n-channel MOSFET ($N_DH$) 43 also for driving the $N_OH$ 44, and an n-channel MOSFET (NH) 41 for controlling the gate potential of the $N_OH$ 44. The second semiconductor circuit system includes an output semiconductor device ($N_OL$) 48 on the Lo-side, a p-channel MOSFET ($P_DL$) 46 for driving $N_OL$ 48, an n-channel MOSFET ($N_DL$) 47 also for driving the $N_OL$ 48, and an n-channel MOSFET (NL) 45 for controlling the gate potential of the $N_OL$ 48. The first and second semiconductor circuit systems control the potential of an inverter output ($D_O$) 40 in response to the control signal output from a level shift circuit 49.

Differently from the circuit in FIG. 3, the gate terminals of the NH 41 and the NL 45 are connected to one end of a capacitor (hereinafter referred to as a "CH") 51 and one end of a capacitor (hereinafter referred to as a "CL") 53, respectively. The other end of the CH 51 is connected to the collector terminal, that is the output terminal, of the $N_OH$ 44 and the other end of the CL 53 to the collector terminal, that is the output terminal, of the $N_OL$ 48. The cathode terminal of a diode (hereinafter referred to as a "DH") 52 is connected to the connection point of the NH 41 and the CH 51 and the anode terminal of DH 52 to the source terminal of the NH 41. Similarly, the cathode terminal of a diode (hereinafter referred to as a "DL") 54 is connected to the connection point of the NL 45 and the CL 53 and the anode terminal of diode the DL 54 to the source terminal of the NL 45.

By setting the gate oxide film thickness in the NH 41 and the NL 45 at 500 nm, the gate oxide films can endure the applied voltage as high as 200 V. Although the gate oxide film thick enough to endure the applied voltage of 200 V can be formed by the usual LSI process (e.g., for forming a LOCOS oxide film), it is hard to form a gate oxide film thick enough to stably sustain the applied voltage as high as 600 V. To overcome this problem, the CH 51 is connected in series to the capacitance between the gate and source of the NH 41, and the CL 53 is connected in series to the capacitance between the gate and source of the NL 45 to divide and suppress the voltages applied to the gates of the NH 41 and the NL 45. When the power supply voltage is 600 V, it is sufficient for the capacitance of the CH 51 or the CL 53 to be half as high as the capacitance between the gate and source of the NH 41 or the NL 45. When the capacitance of the CH 51 or the CL 53 is half as high as the capacitance between the gate and source of the NH 41 or the NL 45, a voltage of 400 V is applied to the CH 51 or the CL 53, and the voltage between the gate and source of the NH 41 or the NL 45 is suppressed to be 200 V. For over voltage protection, it is sufficient for the DH 52 and the DL 54 to exhibit the breakdown voltage of 200 V. Since it is almost unnecessary for the DH 52 and the DL 54 to flow current therein, the DH 52 and the DL 54 can be small in size with no problem.

When the threshold value of the NH 41 and the NL 45 is 15.6 V in the circuit shown in FIG. 4, the NH 41 and the NL 45 are brought into the respective OFF-states and the resistance values of these devices become high, as the output voltage of the $N_OH$ 44 and the $N_OL$ 48 becomes equal to or lower than 46.8 V, which is 15.6 (V)×3 (times). Therefore, the NH 41 and the NL 45 are ON while the $N_OH$ 44 and the $N_OL$ 48 shift from the OFF-state to the ON-state, while the output voltages, i.e., the voltages of the high-potential-side terminals of the output semiconductor devices ($N_OH$ 44 and $N_OL$ 48), are between 600 V and 46.8 V. Therefore, the resistance of the NH 41 and the NL 45 is low in this period of time. Consequently, the $N_OH$ 44 and the $N_OL$ 48 can turn ON softly.

Thus, the semiconductor circuit according to the first embodiment can prevent a general inverter circuit from operating in the dangerous zone relatively easily. Next, a circuit configuration according to a second embodiment, which controls the resistance value of a resistor disposed in a driver circuit to control the power supply voltage of the driver circuit, will be described in detail below with reference to the accompanied FIGS. 5 and 6.

Figure 5:
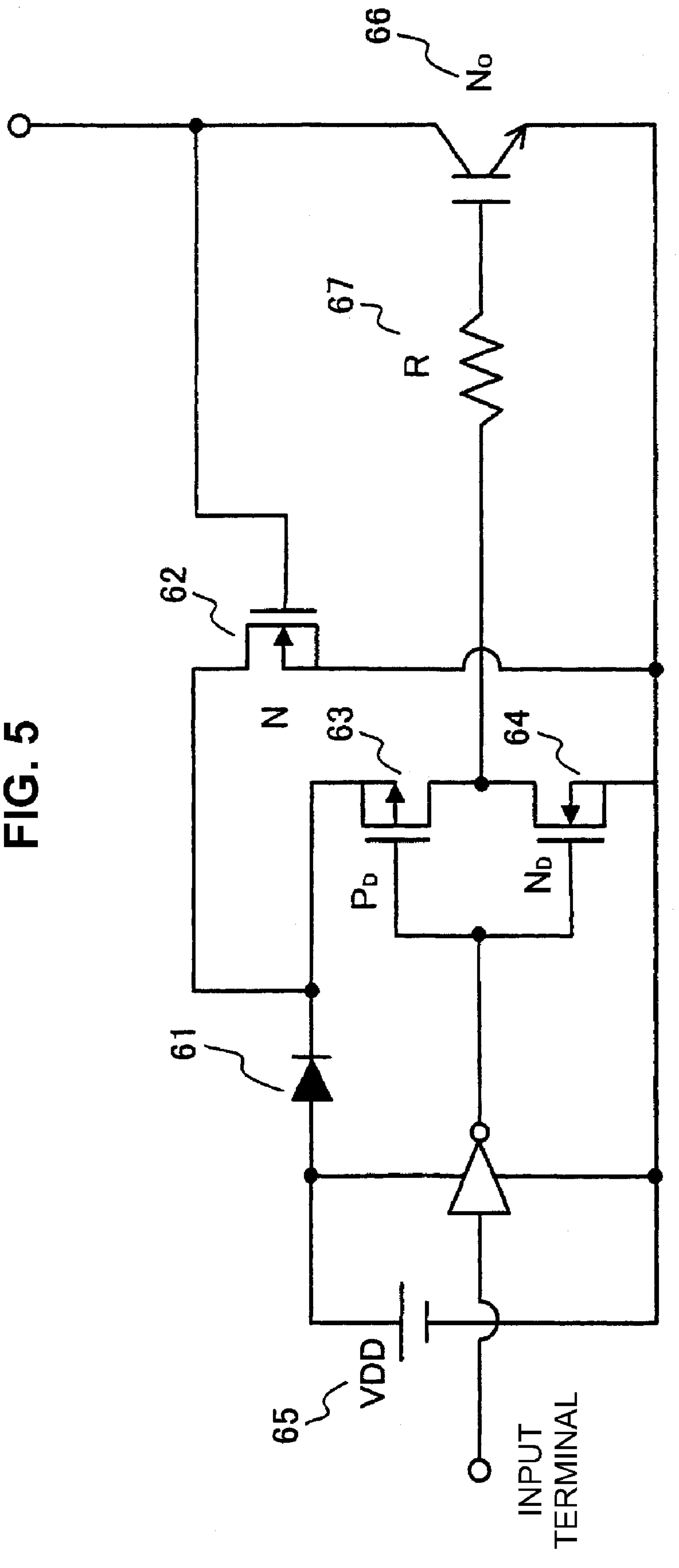
FIG. 5 is a block circuit diagram of a semiconductor circuit according to a second embodiment of the present invention.

FIG. 5 is a block circuit diagram of a semiconductor circuit according to the second embodiment of the invention. In the same manner as in the semiconductor circuit according to the first embodiment, the semiconductor circuit according to the second embodiment includes a driver circuit including a p-channel MOSFET ($P_D$) 63, an n-channel MOSFET ($N_D$) 64, and a control power supply (VDD) 65, an n-channel IGBT ($N_O$) 66 exhibiting a high breakdown voltage and working as an output device, a diode 61 inserted between the $P_D$ 63 and the VDD 65, and a voltage-controlled semiconductor device (N) 62 arranged between the diode 61 and the $N_O$ 66.

The diode 61 is arranged between the power supply terminal at the last stage of the driver circuit and the VDD 65. The anode terminal of the diode 61 is connected to the positive potential side of the VDD 65. The cathode terminal of the diode 61 is connected to the source terminal of the $P_D$ 63. For example, the diode 61 is a junction diode exhibiting nonlinear current vs. voltage characteristics that works as a resistor for lowering the power supply voltage of the VDD 65. Alternatively, a resistor that exhibits nonlinear current vs. voltage characteristics can be substituted for the diode 61.

The N 62 is formed, for example, of an n-channel MOSFET controllable with a high voltage in the same manner as according to the first embodiment. The drain terminal of the N 62 is connected to the cathode terminal of the diode 61 and therefore, to the source terminal of the $P_D$ 63. The source terminal of the N 62 is connected to the emitter terminal, which is the reference terminal, of the $N_O$ 66 and to the source terminal of the $N_D$ 64. The gate terminal of the N 62 is connected to the collector terminal, which is the output terminal of the $N_O$ 66. Due to the above-described connections, the gate terminal of the N 62 is connected to the potential (output potential) of the $N_O$ 66, the difference of which from the source terminal potential of the N 62 changes in response to the switching operations of the $N_O$ 66.

When the input terminal is set at the Hi-level, the $P_D$ 63 is OFF and the $N_D$ 64 is ON. Since the gate potential of the $N_O$ 66 connected to the $P_D$ 63 and the $N_D$ 64 is set at the Lo-level, the $N_O$ 66 is brought into the OFF-state. In this state, by connecting the output terminal of the $N_O$ 66 to the high potential side of a high-voltage circuit disposed separately and the negative electrode of the VDD 65 to the low potential side of the high-voltage circuit, a desired high voltage is applied between the collector and emitter of the $N_O$ 66. At this time, the gate terminal of the N 62 is brought into the ON-state.

As the input terminal potential is changed over to the Lo-level in this state, the $P_D$ 63 is brought into the ON-state and the gate potential of the $N_O$ 66 rises. Since the high voltage is still being applied to the output terminal of the $N_O$ 66 at this instance, N the 62 is ON and, therefore, the gate voltage of the $N_O$ 66 is suppressed to be lower by the voltage drop across the diode 61. If the output terminal of the $N_O$ 66 is short-circuited directly with the power supply, the output terminal voltage of the $N_O$ 66 will not lower. Consequently, since the gate potential of the $N_O$ 66 remains low and the $N_O$ 66 is in the state where the current driving ability thereof is low, the $N_O$ 66 is hardly destroyed.

As described above, the semiconductor circuit according to the second embodiment also can prevent noises via the feedback capacitance with the simple circuit configuration thereof and can protect the devices thereof from an over voltage, when an anomaly occurs. As a modification of the semiconductor circuit according to the second embodiment, the diode 61 is used commonly, a plurality of the driver circuits (each including the $P_D$ 63 and the $N_D$ 64) can be disposed on the output stage, and the drain terminals of the voltage-controlled semiconductor devices (Ns) 62, disposed corresponding to the respective driver circuits, can be connected to the cathode terminal of the diode 61. When the output potential of any one of the multiple semiconductor circuit systems is high, the driving power of the output from the every other semiconductor circuit system is suppressed.

The semiconductor circuit according to the second embodiment is applicable, in the same manner as the semiconductor circuit according to the first embodiment, to the scan driver IC and the sustain driver circuit of a plasma display or to a general inverter circuit. For example, the semiconductor circuit according to the second embodiment can be applied to the Lo-side of the scan driver IC shown in FIG. 2. In the sustain driver circuit shown in FIG. 3, the semiconductor circuit according to the second embodiment can be applied to the Hi- and Lo-sides.

Figure 6:
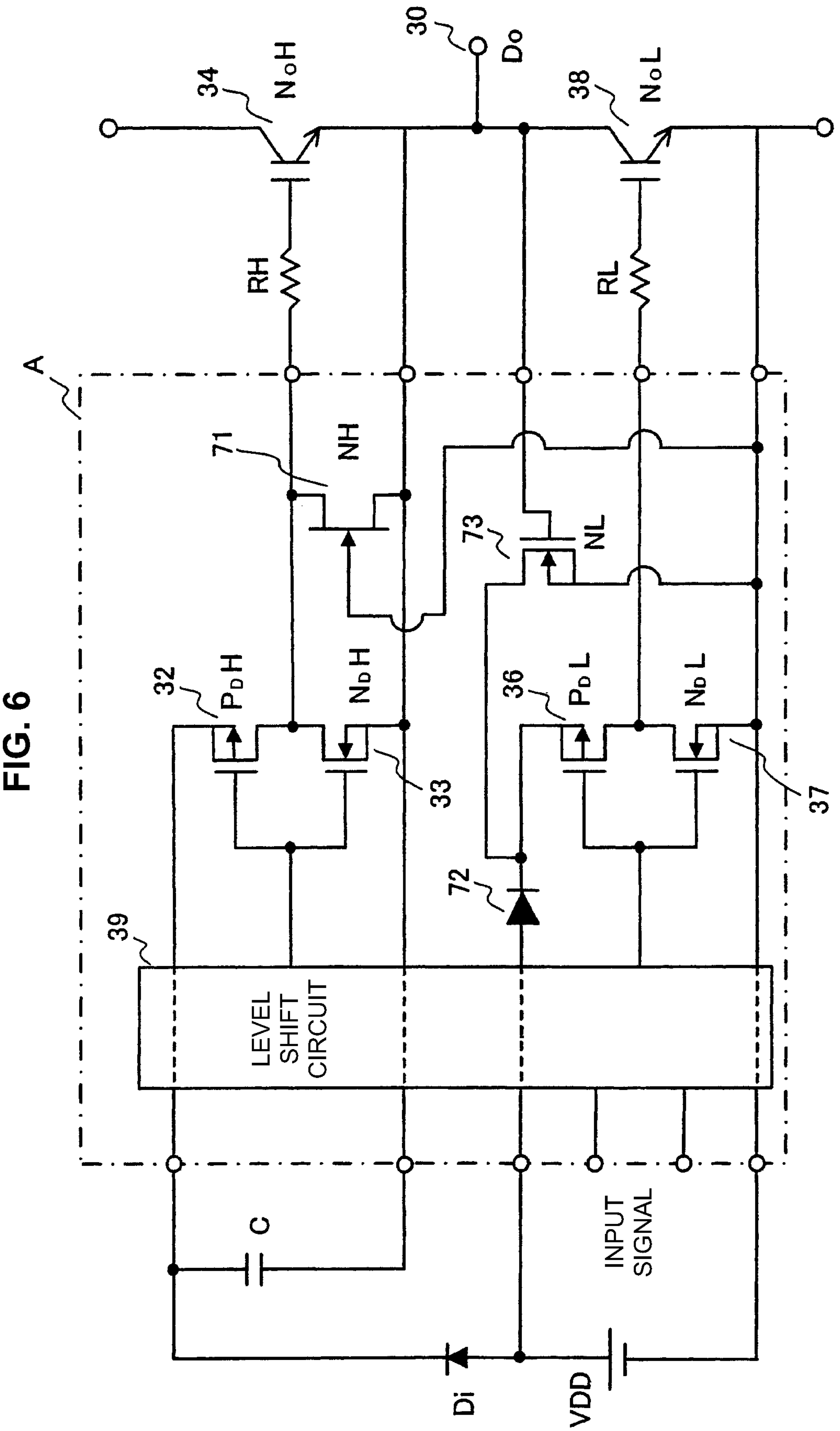
FIG. 6 is a block circuit diagram of a second embodiment of a sustain driver circuit including the semiconductor circuit according to the second embodiment.
Figure 7:
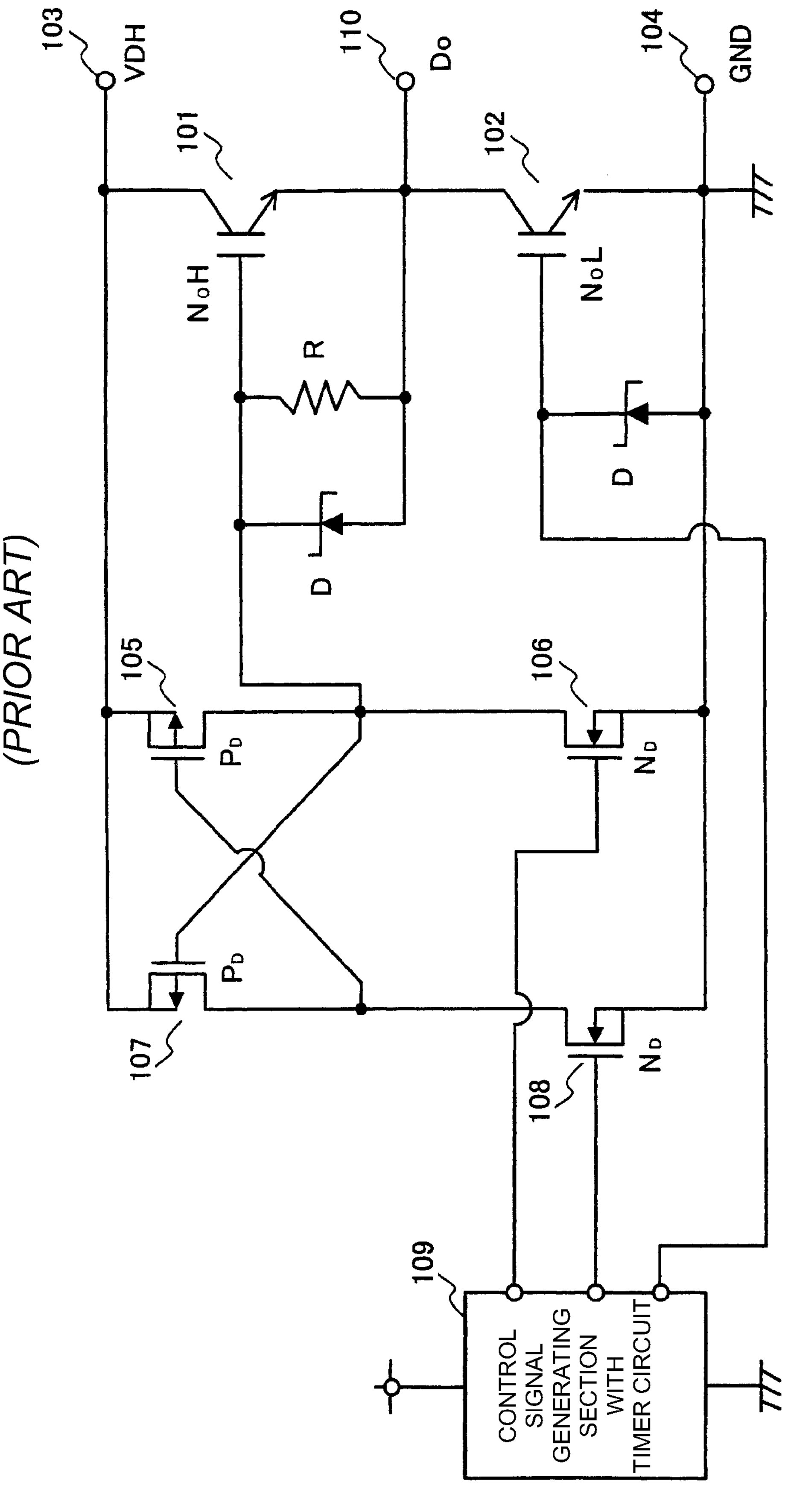
FIG. 7 (PRIOR ART)
FIG. 7 is a block circuit diagram of a conventional scan driver IC.
Figure 8:
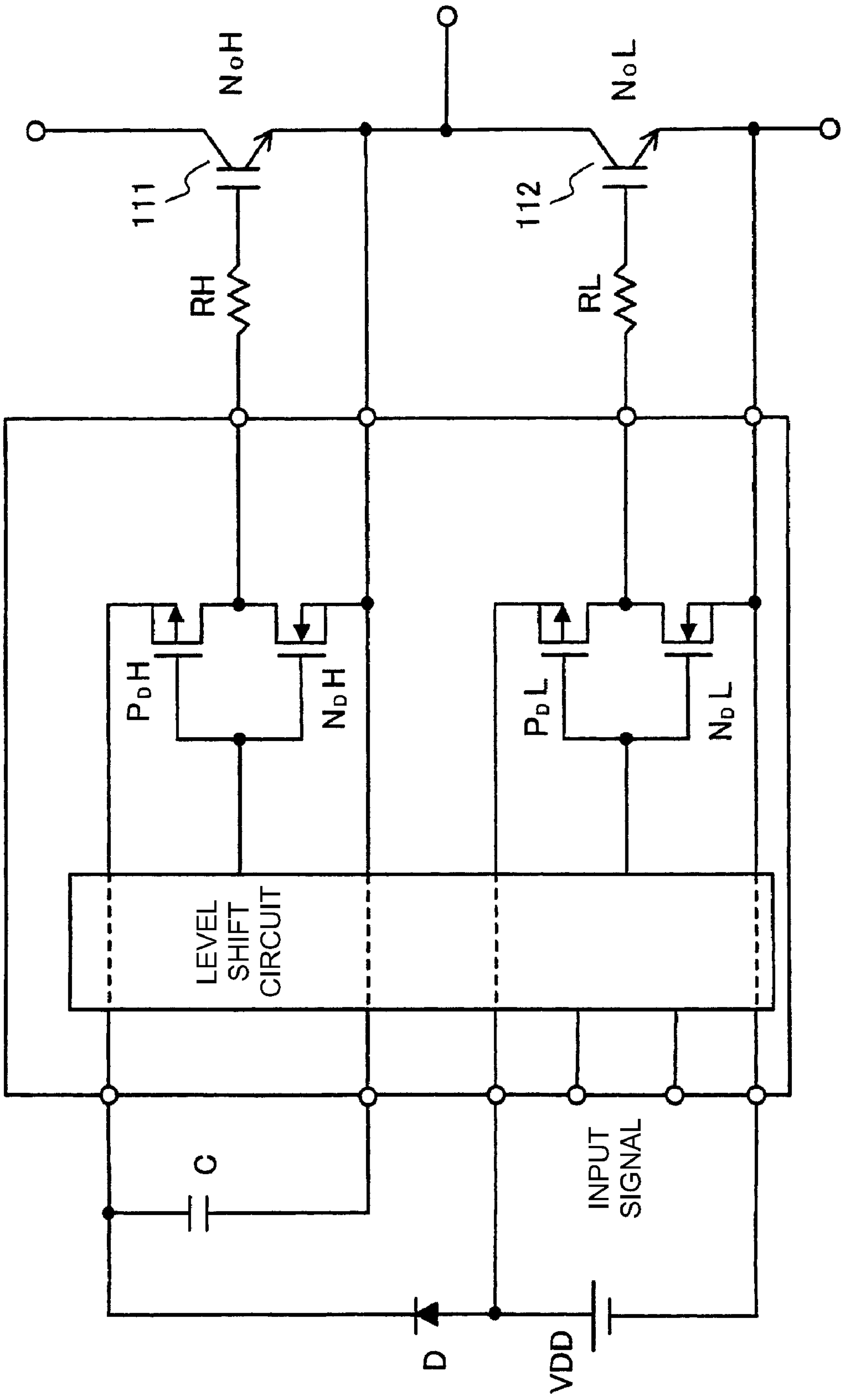
FIG. 8 (PRIOR ART)
FIG. 8 is an equivalent circuit diagram of a conventional sustain driver circuit.
Figure 9:
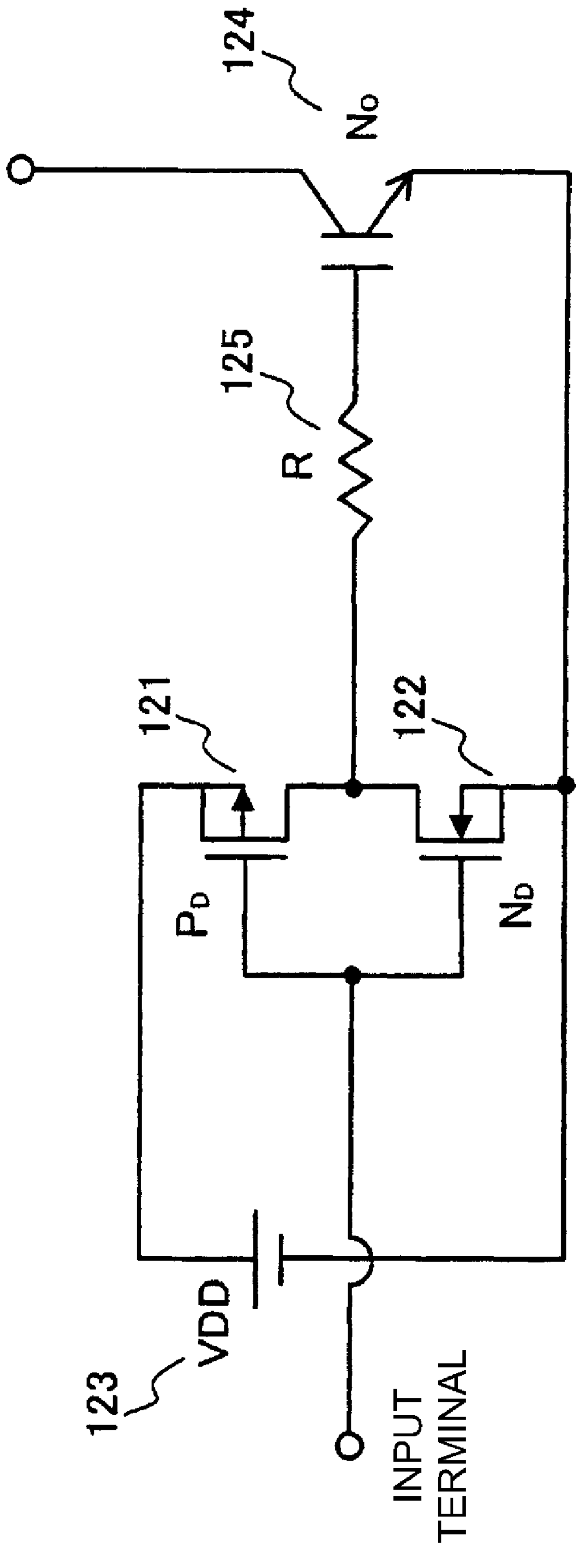
FIG. 9 (PRIOR ART)
FIG. 9 is a fundamental block circuit diagram of a conventional driver circuit.

FIG. 6 is a block circuit diagram of a sustain driver circuit incorporating the semiconductor circuit according to the second embodiment is applied. The sustain driver circuit shown in FIG. 6 arranges an n-type junction FET (NH) 71 substituting for NH 31 on the Hi-side and a diode (D) 72 and an n-channel MOSFET (NL) 73 as shown in FIG. 3 substituting for NL 35 on the Lo-side in the sustain driver circuit shown in FIG. 3. The same letters and numerals as used in FIG. 3 are used to designate the same constituent elements and their duplicated descriptions are omitted for the sake of brevity.

Since the NH 71 is an n-channel junction-type FET exhibiting low resistance at a low gate voltage (0 V) and high resistance at a high gate voltage, it is preferable to connect the gate terminal thereof to the negative potential side. In FIG. 6, the gate terminal of the NH 71 is connected to the negative potential side of the control power supply (VDD). In this case, the NH 71 is normally ON in different from the n-channel MOSFET described earlier and never in the perfect OFF-state. However, the NH 71 exhibits the same effects as those the n-channel MOSFET described earlier.

The circuit configuration on the Lo-side including the D 72 and the NL 73 is the same with the circuit configuration shown in FIG. 5. The circuit configuration on the Lo-side can suppress the gate voltage of the $N_O$L 38 to be lower by the voltage drop across the D 72. Alternatively, the diode shown in FIG. 5 can be disposed also on the Hi-side and the drain terminal of the NH 71 can be connected to the diode cathode terminal with no problem.

A semiconductor apparatus can be obtained by forming one or more semiconductor circuits according to the first or second embodiment or one or more inverter circuits, each employing the semiconductor circuit according to the first or second embodiment, on a semiconductor substrate. The semiconductor apparatus formed as described above exhibits the same effects as those the semiconductor circuit according to the first or second embodiment.

Alternatively, a semiconductor apparatus can be obtained by forming one or more semiconductor circuits excluding the output semiconductor devices thereof on a semiconductor substrate, disposing the gate terminal of the every voltage-controlled semiconductor device independently and connecting the gate terminal of the every voltage-controlled semiconductor device to the relevant output semiconductor device formed on the other semiconductor substrate.

The voltage-controlled semiconductor device can be connected between the gate and reference terminals of the output semiconductor device to make the voltage-controlled semiconductor device function as gate resistance of the output semiconductor device. By connecting the gate terminal to the output terminal of the output semiconductor device, the potential can be dynamically changed in response to the operations of the output semiconductor device. That is, the gate resistance value of the output semiconductor device can be changed automatically in response to the output potential of the output semiconductor device to control the gate potential of the output semiconductor device.

Arranging the resistor between the power supply terminal in the last output stage of the driver circuit for driving the output semiconductor device and the power supply, and connecting the gate terminal of the voltage-controlled semiconductor device between the power supply terminal of the driver circuit and the reference terminal of the output semiconductor device, allows the potential to be dynamically changed in response to the operations of the output semiconductor device. The connections described above facilitate automatically changing the resistance value of the resistor arranged in the driver circuit in response to the output potential of the output semiconductor device to control the power supply voltage of the driver circuit.

While the present invention has been particularly shown and described with reference to preferred embodiments thereof, it will be understood by those skilled in the art that the foregoing and other changes in form and details can be made therein without departing from the spirit and scope of the present invention. All modifications and equivalents attainable by one versed in the art from the present disclosure within the scope and spirit of the present invention are to be included as further embodiments of the present invention. The scope of the present invention accordingly is to be defined as set forth in the appended claims.

This application is based on, and claims priority to, JP PA 2005-269359, filed on 16 Sep. 2005. The disclosure of the priority application, in its entirety, including the drawings, claims, and the specification thereof, is incorporated herein by reference.

What is claimed is:

1. A semiconductor circuit comprising:

an output semiconductor device including an output terminal, a control terminal and a reference terminal;

a driver circuit for driving the output semiconductor device, the driver circuit including an output coupled to the control terminal of the output semiconductor device; and a voltage-controlled semiconductor device including a drain coupled to the control terminal of the output semiconductor device, a source coupled to the reference terminal of the output semiconductor device, and a gate coupled to the output terminal of the output semiconductor device;

wherein, when a potential difference between the control terminal and the reference terminal of output semiconductor device exceeds a predetermined value, the voltage controlled semiconductor device switches to an ON-state to reduce the voltage applied to the control terminal.

2. A semiconductor circuit as claimed in claim 1, wherein the voltage-controlled semiconductor device includes a gate oxide film of 500 nm in thickness.

3. A semiconductor circuit as claimed in claim 1, wherein the drain of the voltage-controlled semiconductor device is coupled to the control terminal of the output semiconductor device via a resistor.

4. A semiconductor circuit as claimed in claim 1, wherein the driver circuit includes a first transistor and a second transistor each including a control terminal coupled to an input terminal of the semiconductor circuit.

5. The semiconductor circuit according to claim 1, wherein the voltage-controlled semiconductor device comprises one of a MOSFET or a junction-type FET.

6. A semiconductor circuit as claimed in claim 4, wherein the first transistor is a p-channel MOSFET and the second transistor is an n-channel MOSFET.

7. A semiconductor circuit as claimed in claim 6, wherein a source of the p-channel MOSFET is configured to be coupled to a positive terminal of a control power supply and a source terminal of the n-channel MOSFET is configured to be coupled to a negative terminal of the control power supply, and wherein drains of both the p-channel MOSFET and the N-channel MOSFET are coupled to the control terminal of the output semiconductor device.

8. A semiconductor circuit comprising:

a high-side output semiconductor device including a high-side output terminal, a control terminal and a reference terminal;

a low-side output semiconductor device including a low-side output terminal, a control terminal and a reference terminal, a driver circuit including an output coupled to the control terminal of the high-side output semiconductor device;

a high-side voltage-controlled semiconductor device including a drain coupled to the control terminal of the output semiconductor device, a source coupled to the reference terminal of the output semiconductor device, and a gate coupled to the high-side output terminal of the high-side output semiconductor device; and a low-side voltage-controlled semiconductor device including a drain coupled to the control terminal of the low-side output semiconductor device, a source coupled to the reference terminal of the low-side output semiconductor device, and a gate coupled to the low-side output terminal of the low-side output semiconductor device;

wherein the low-side output terminal of the low-side output semiconductor device and the reference terminal of the high-side output semiconductor device are coupled together to an output terminal of the semiconductor circuit.

9. A semiconductor circuit as claimed in claim 8, the high-side output terminal of the high-side voltage controlled semiconductor device is configured to be coupled to a high-potential power supply, and the reference terminal of the low-side voltage controlled semiconductor device is configured to be coupled to ground.

10. A semiconductor circuit as claimed in claim 8, wherein the driver circuit includes first and second p-channel MOSFETS and first and second n-channel MOSFETS, sources of the first and second p-channel MOSFETS are coupled to the high potential power supply, sources of the first and second n-channel MOSFETS are coupled to ground, drains of the first and second p-channel MOSFETS are respectively coupled to drains of the first and second n-channel MOSFETS, a gate of the first p-channel MOSFET is coupled to the drain of the second p-channel MOSFET and the gate of the second p-channel MOSFET is coupled to the drain of the first p-channel MOSFET, and the gates of the first and second n-channel MOSFETS are configured to be coupled to a control signal generator.

11. A semiconductor circuit as claimed in claim 8, wherein the control terminal of the low-side output semiconductor device is configured to be coupled to a control signal generator.

12. A semiconductor circuit as claimed in claim 8, wherein the driver circuit includes a high-side pair of transistors and a low-side pair of transistors, drains of the high-side pair of transistors are coupled to the control terminal of the high-side output semiconductor device and drains of the low-side pair of transistors are coupled to the control terminal of the low-side output semiconductor device, gates of the high-side pair of transistors are coupled to a first output of a level shift circuit and gates of the low-side pair of transistors are coupled to a second output of the level shift circuit.

13. A semiconductor circuit as claimed in claim 8, wherein the high-side pair of transistors and the low-side pair of transistors each include a p-channel MOSFET and an n-channel MOSFET, and wherein a source of the n-channel MOSFET of the high-side pair of transistors is coupled to the reference terminal of the high-side output semiconductor device and a source of the n-channel MOSFET of the low-side pair of transistors is coupled to the reference terminal of the low-side output semiconductor device.

14. A semiconductor circuit as claimed in claim 8, wherein the high-side voltage controlled semiconductor device, the low-side semiconductor device and the driver circuit are constructed in a single substrate separate from the high-side output semiconductor device and the low-side output semiconductor device.

15. A semiconductor circuit as claimed in claim 8, wherein the drain of the high-side voltage controlled semiconductor device is coupled to the control terminal of the high-side output semiconductor device via a high side resistor and the drain of the low-side voltage controlled semiconductor device is coupled to the control terminal of the low-side output semiconductor device via a low side resistor.

16. A semiconductor circuit as claimed in claim 8, wherein the gate of the high-side voltage controlled semiconductor device is coupled to the high-side terminal of the high-side output semiconductor device via a high side capacitor and the gate of the low-side voltage controlled semiconductor device is coupled to the low-side terminal of the low-side output semiconductor device via a low side capacitor, and wherein a high-side diode is provided that includes a cathode and an anode respectively coupled to the gate and the source of the high-side voltage controlled semiconductor device and a low-side diode is provided that includes a cathode and an anode respectively coupled to the gate and the source of the low-side voltage controlled semiconductor device.

17. The semiconductor circuit according to claim 8, wherein the high-side voltage-controlled semiconductor device and the low-side voltage-controlled semiconductor device each comprise one of a MOSFET or a junction-type FET.

18. A semiconductor circuit as claimed in claim 10, wherein the control terminal of the low-side output semiconductor device is configured to be coupled to the control signal generator.

19. A semiconductor circuit comprising:

an output semiconductor device including an output terminal, a control terminal and a reference terminal;

a driver circuit for driving the output semiconductor device, the driver circuit including an output coupled to the control terminal of the output semiconductor device; and a voltage-controlled semiconductor device comprising a source coupled to the reference terminal of the output semiconductor device, a gate coupled to the output terminal of the output semiconductor device, and a drain configured to be coupled to a positive terminal of a control power supply.

20. A semiconductor circuit as claimed in claim 16, wherein the driver circuit includes a p-channel MOSFET and an n-channel MOSFET, the drains of the p-channel and n-channel MOSFETS are coupled together and to the control terminal of the output semiconductor device, and the gates of the p-channel and n-channel MOSFETS are coupled to an input terminal of the semiconductor circuit.

21. A semiconductor circuit comprising:

a high-side output semiconductor device including a high-side output terminal, a control terminal and a reference terminal;

a low-side output semiconductor device including a low-side output terminal, a control terminal and a reference terminal, a driver circuit including a high side output connected to the control terminal of the high-side output semiconductor device and a low side output connected to the control terminal of the low-side output semiconductor device;

a high-side voltage-controlled semiconductor device including a first terminal coupled to the control terminal of the output semiconductor device, a control terminal coupled to the reference terminal of the low-side output semiconductor, and a second terminal coupled to the reference terminal of the high-side output semiconductor device; and a low-side voltage-controlled semiconductor device comprising a source coupled to the reference terminal of the low-side output semiconductor device, a gate coupled to the low-side output terminal of the low-side output semiconductor device, and a drain configured to be coupled to a positive terminal of a control power supply.

22. A semiconductor circuit as claimed in claim 21, wherein the driver circuit, the high-side voltage controlled semiconductor device and the low-side voltage controlled semiconductor device are constructed in a single substrate separate from the high-side output semiconductor device and the low-side output semiconductor device.

* * * * *